(12) United States Patent
Kikuta

(10) Patent No.: US 6,359,329 B1
(45) Date of Patent: Mar. 19, 2002

(54) EMBEDDED WIRING STRUCTURE AND METHOD FOR FORMING THE SAME

(75) Inventor: Kuniko Kikuta, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/386,823

(22) Filed: Aug. 31, 1999

(30) Foreign Application Priority Data

Sep. 4, 1998  (JP) ............................................. 10-250803

(51) Int. Cl.⁷ ................................................. H01L 29/06
(52) U.S. Cl. ....................... 257/622; 257/520; 257/750; 438/672
(58) Field of Search ................................. 257/622, 624, 257/626, 520, 750; 438/672, 675, 629

(56) References Cited

U.S. PATENT DOCUMENTS 5,854,515 A * 12/1998 Bandypopadhyay et al.
5,925,933 A * 7/1999 Colgan et al.
5,935,515 A * 8/1999 Fang et al.
6,110,826 A * 8/2000 Lou et al.

FOREIGN PATENT DOCUMENTS

| JP | 8-201399 | 8/1996 |
|---|---|---|
| JP | 8-213459 | 8/1996 |
| JP | 8-316309 | 11/1996 |
| JP | 8-335634 | 12/1996 |
| JP | 10-199972 | 7/1998 |
| JP | 10-199974 | 7/1998 |

* cited by examiner

Primary Examiner—Sheila V. Clark
(74) Attorney, Agent, or Firm—Rosenman & Colin LLP

(57) ABSTRACT

Disclosed herein is an embedded wiring structure comprising: a first interlayer dielectric film, an etch-stop layer and a second interlayer dielectric film sequentially formed on a first wiring layer in which a second wiring layer is formed in contact with a wide wall of a via plug. Since, in this structure, the second wiring layer and the via plug are in contact with each other with a relatively large surface area, deficiencies in electrical connection are hardly generated.

13 Claims, 3 Drawing Sheets

EMBEDDED WIRING STRUCTURE AND METHOD FOR FORMING THE SAME

BACKGROUND OF THE INVENTION (a) Field of the Invention

The present invention relates to an embedded wiring having a single damascenel structure and a method for forming the same, more in detail to the embedded wiring structure having high reliability in electrical connection and the method for forming the same.

(b) Description of the Related Art

With the demand of miniaturization and high integration of semiconductor devices, wirings of the semiconductor device are made finer and multi-layered.

Because of this reason, in place of forming the wiring on a dielectric film, a so-called damascenel process is practiced which forms an embedded metal wiring in a trench of a dielectric film.

A conventional method of forming an embedded metal wiring having a single damascenel structure will be described referring to FIGS. 1A to 1E showing sections of a wafer having the single Damasin structure in consecutive steps of fabrication.

As shown in FIG. 1A, a dielectric layer 11, a wiring layer 12, a first interlayer dielectric film 13 and an etch-stop layer 14 are sequentially formed on a substrate 10.

Then, a via hole 18 which penetrates the etch-stop layer 14 and the first interlayer dielectric film 13 to reach the wiring layer 12 is formed as shown in FIG. 1B.

The via hole 18 is filled with tungsten (W) formed as a conductive film by sputtering, and the W film on the etch-stop layer 14 is removed by etch-back to leave a via plug 20 as shown in FIG. 1C.

Then, a second interlayer dielectric film 22 is formed on the etch-stop layer 14, and a photoresist film (not shown) is formed on the dielectric film 22 and is patterned to make a mask. The dielectric film 22 is selectively etched by employing the mask to form a wiring trench 24 therein and the photoresist film is removed (FIG. 1D).

A metal film of a low electric resistance made of, for example, aluminum or copper is then deposited on the dielectric film 22 including the side wall and the bottom wall of the wiring trench 24, and the metal film on the dielectric film 22 is removed to leave an embedded wiring 26 having a single damascenel structure (FIG. 1E).

When, however, the embedded wiring having the single damascenel structure is formed in accordance with the conventional method as described above, an imprecise positional alignment is liable to occur between the via plug and the wiring trench. As a result, deficiencies in electrical connection may be generated between the via plug and the wiring trench. This problem is more remarkable when a so-called border-less via structure is formed in which the width of an embedded wiring is reduced as narrow as to that of a via plug for miniaturization and high integration of semiconductor devices.

SUMMARY OF THE INVENTION

In view of the foregoing, an object of the present invention is to provide an embedded wiring of a single damascenel structure having a high reliability in electrical connection, and a method for forming the same.

The present invention provides, in a first aspect, an embedded wiring structure comprising: a substrate; a first wiring layer, a first interlayer dielectric film, an etch-stop layer and a second interlayer dielectric film having therein a wiring trench consecutively formed to overlie the substrate; a via plug penetrating the second interlayer dielectric film, the etch-stop layer and the first interlayer dielectric film to reach the first wiring layer; and a second wiring layer embedded in the wiring trench and in contact with an upper side wall of the via plug.

The present invention provides, in a second aspect, a method for forming an embedded wiring structure comprising the steps of: forming a first wiring layer overlying a substrate; sequentially forming a first interlayer dielectric film, an etch-stop layer and a second interlayer dielectric film on the first wiring layer; forming a via hole penetrating the second interlayer dielectric film, the etch-stop layer and the first interlayer dielectric film to reach the first wiring layer; forming a via plug in the via hole; patterning the second interlayer dielectric film to form a wiring trench which exposes an upper side wall of the via plug; and forming a second wiring layer in contact with an upper side wall of the contact plug.

In accordance with the present invention, since the embedded wiring and the via plug are in contact with each other with a relatively large surface area, deficiencies in electrical connection are hardly generated, and reliability in the electrical connection is significantly higher than that of a conventional connection structure.

Especially effective performance can be obtained in the present invention if the wiring trench and the via plug have the same width.

A low electric resistance metal which may be employed in the metal film in the present invention includes and is not restricted to aluminum and copper. An alloy including one of these metals can be also employed.

The above and other objects, features and advantages of the present invention will be more apparent from the following description.

PREFERRED EMBODIMENTS OF THE INVENTION

Now, the present invention is more specifically described with reference to accompanying drawings.

Embodiment 1

Figure 1A:
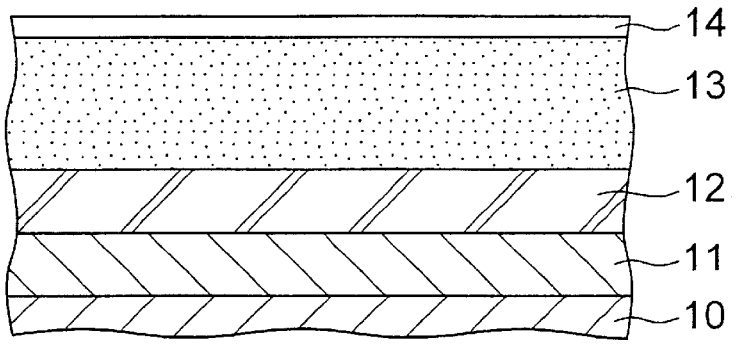
FIGS. 1A to 1E are schematic sectional views showing a wafer in consecutive steps of a conventional method of forming an embedded wiring structure.
Figure 1B:
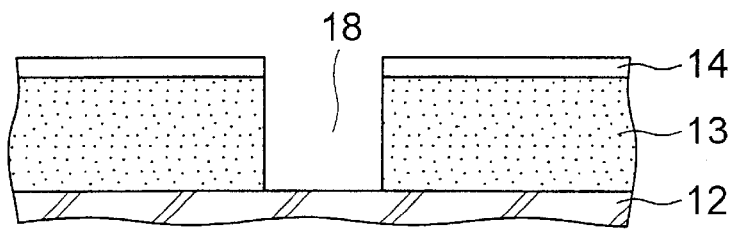
Figure 1C:
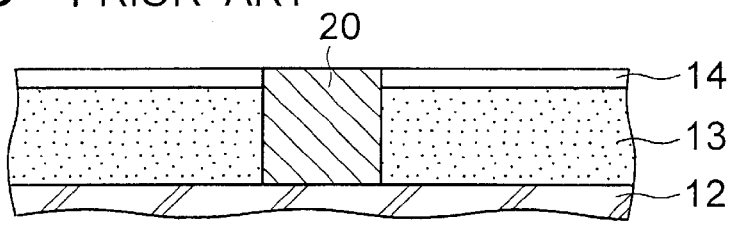
Figure 1D:
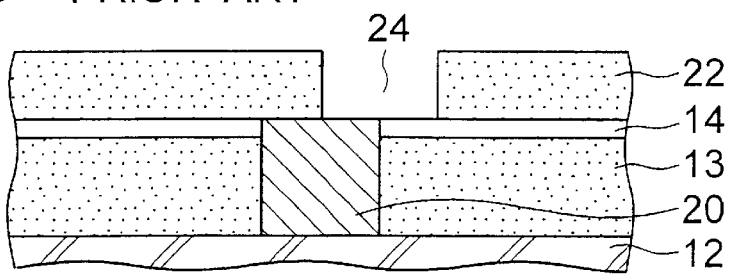
Figure 1E:
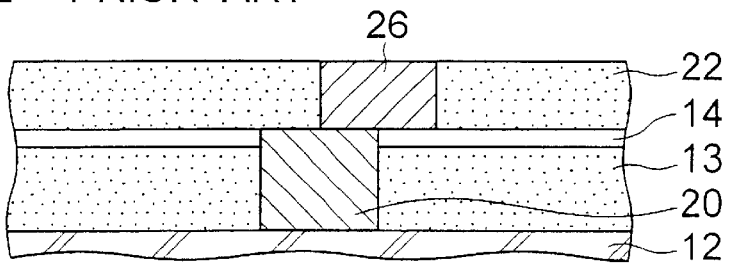
Figure 2A:
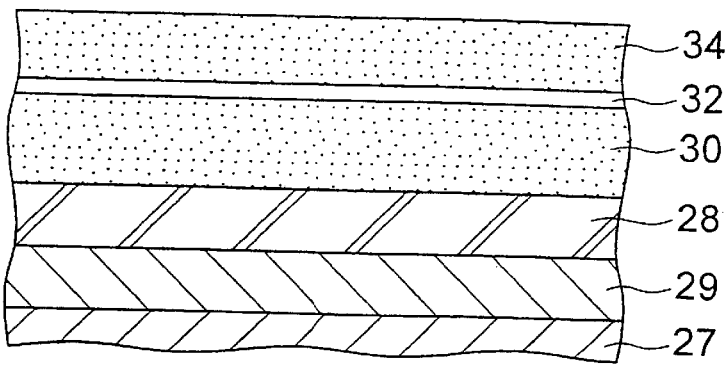
FIGS. 2A to 2E are schematic sectional views showing a wafer in consecutive steps of a method of forming an embedded wiring structure in accordance with an embodiment of the present invention.

As shown in FIG. 2A, a dielectric film 29, a first wiring layer 28, a first interlayer dielectric film 30, an etch-stop layer 32 made of silicon nitride and a second interlayer dielectric film 34 are sequentially formed on a silicon substrate 27.

Figure 2B:
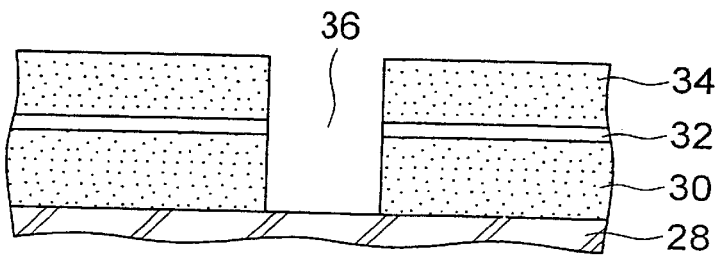

Then, a via hole 36 which penetrates the second interlayer dielectric film 34, the etch-stop layer 32 and the first interlayer dielectric film 30 to reach the first wiring layer 28 is formed as shown in FIG. 2B.

Figure 2C:
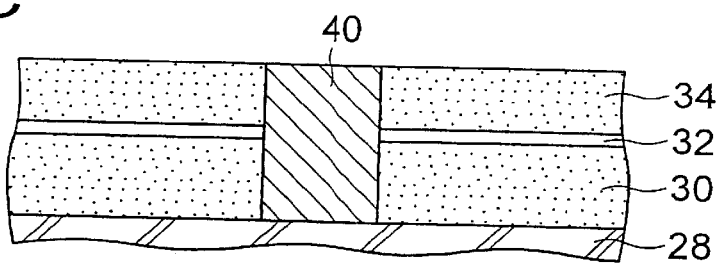

The via hole 36 is filled with tungsten (W) formed as a conductive film by sputtering, and during this procedure, a tungsten film is also formed on the surface of the second interlayer dielectric film 34. The tungsten film is then removed by an etch-back to leave a via plug 40 in the via hole 36 as shown in FIG. 2C.

Figure 2D:
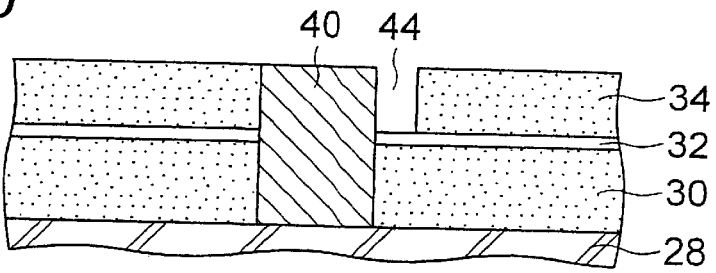

Then, a photoresist film (not shown) is formed on the second interlayer dielectric film 34 and is patterned to form a mask pattern. The dielectric film 34 is selectively etched by using the mask to form a wiring trench 44 adjacent to the via plug 40 as shown in FIG. 2D. The etching is automatically stopped by the etch-stop layer 32.

Figure 3A:
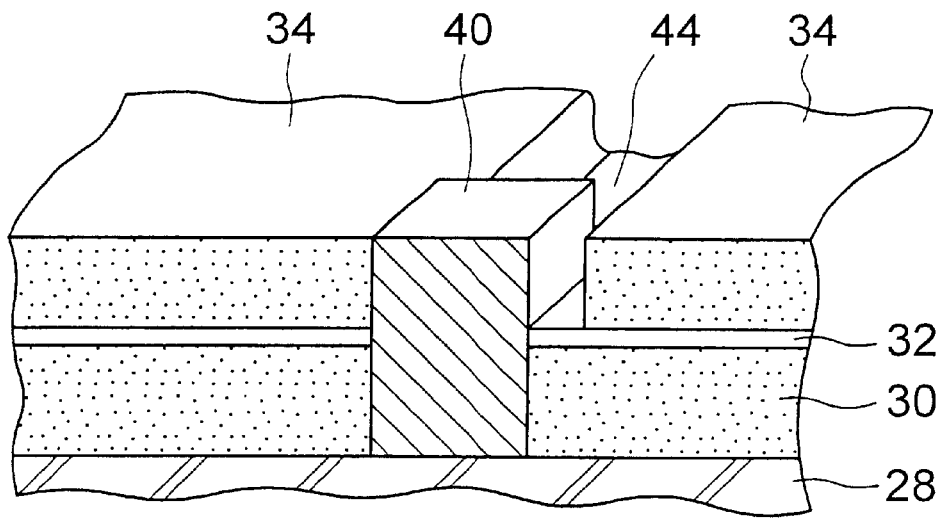
FIGS. 3A and 3B are perspective views partly in section showing the structures of FIGS. 2D and 2E, respectively.

As shown in a three-dimensional structure at this stage (FIG. 3A), the upper rear and upper side walls of the via plug 40 are exposed in the wiring trench 44 which has the same width as that of the via plug 40.

Figure 2E:
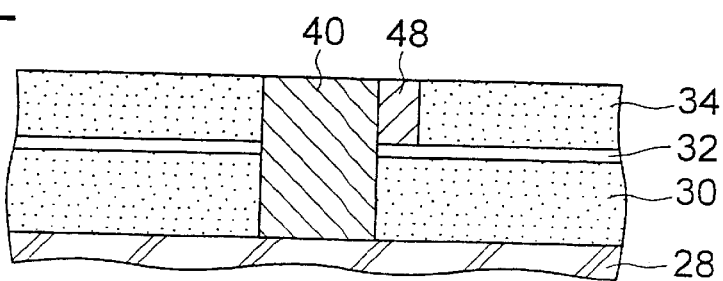
Figure 3B:
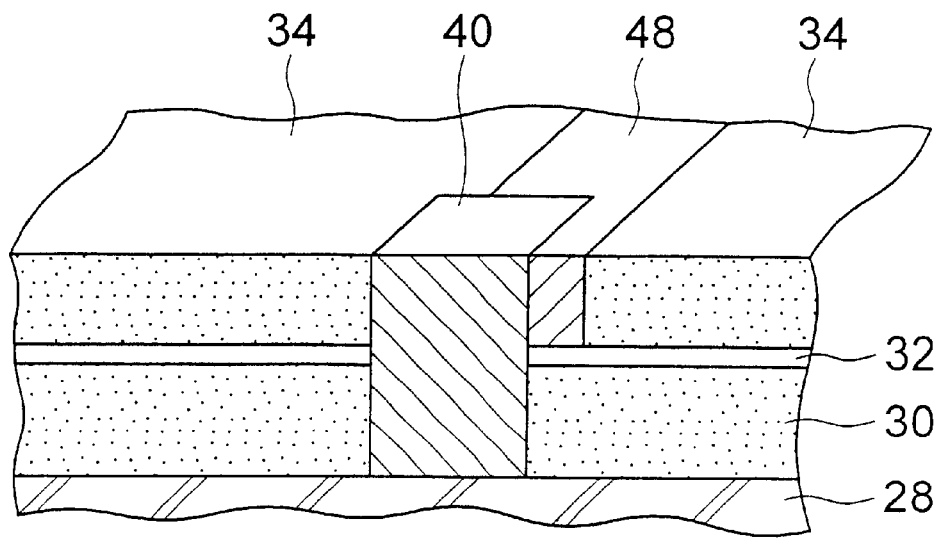

Then, a metal film made of a low electric resistance metal such as aluminum and copper is sputtered onto the entire surface including top surfaces of the second interlayer dielectric film 34 and of the via plug 40 as well as the wiring trench. Then, the metal film on the second interlayer dielectric film 34 and the via plug is removed by a CMP process to form an embedded wiring layer 48 having a damascenel structure shown in FIGS. 2E and 3B.

Since the embedded wiring layer 48 having the single damascenel structure obtained in the present embodiment is in electrical connection with the upper rear wall and with the upper side wall of the via plug 40 with a relatively large surface area, deficiencies in the electric connection are hardly generated even if an imprecise positional alignment between the via plug and the wiring trench occurs. Accordingly, reliability of the electrical connection is significantly higher than that of the conventional connection structure.

Since the above embodiments are described only for examples, the present invention is not limited to the above embodiments and various modifications or alternations can be easily made therefrom by those skilled in the art without departing from the scope of the present invention.

What is claimed is:

1. An embedded wiring structure comprising:

a substrate;

a first wiring layer, a first interlayer dielectric film, an etch-stop layer and a second interlayer dielectric film having therein a wiring trench consecutively formed to overlie said substrate;

a via plug having two opposite side walls penetrating said second interlayer dielectric film, said etch-stop layer and said first interlayer dielectric film to reach said first wiring layer; and a second wiring layer embedded in said wiring trench and in contact with an upper portion of only one of said two opposite side walls of said via plug to improve reliability in electrical connection of the embedded wiring structure.

2. The embedded wiring structure as claimed in claim 1, wherein said wiring trench and said via plug have the same width.

3. The embedded wiring structure as claimed in claim 1, wherein said etch-stop layer is made of silicon nitride.

4. The embedded wiring structure as claimed in claim 1, wherein said via plug is made of tungsten or a tungsten alloy.

5. An embedded wiring structure comprising:

a substrate;

a first wiring layer, a first interlayer dielectric film, an etch-stop layer and a second interlayer dielectric film dielectric film having therein a wiring trench consecutively formed to overlie said substrate;

a via plug penetrating said second interlayer dielectric film, said etch-stop layer and said first interlayer dielectric film to reach said first wiring layer; and a second wiring layer embedded in said wiring trench and in contact with an upper side wall of said via plug, wherein said second wiring layer is made of a metal selected from the group consisting of aluminum, copper and an alloy including one metal of said group.

6. A method for forming an embedded wiring structure comprising the steps of:

forming a first wiring layer overlying a substrate;

sequentially forming a first interlayer dielectric film, an etch-stop layer and a second interlayer dielectric film on the first wiring layer;

forming a via plug having two opposite side walls in said via hole;

patterning said second interlayer dielectric film to form a wiring trench which exposes an upper portion of each of said two opposite side walls of said via plug; and then forming a second wiring layer in contact with said upper portion of only one of said two opposite side walls of said contact plug to improve reliability of electrical connection of the embedded wiring structure.

7. The method for forming the embedded wiring structure as claimed in claim 6, wherein said etch-stop layer is made of silicon nitride.

8. The method for forming the embedded wiring structure as claimed in claim 6, wherein said patterning step is stopped by said etch-stop layer.

9. The method for forming the embedded wiring structure as claimed in claim 6, wherein the said second wiring layer forming step includes the step of chemical-mechanical polishing a metal film on said second interlayer dielectric film.

10. The embedded wiring structure as claimed in claim 1, wherein said second wiring layer is also in contact with an upper rear wall of said via plug.

11. The embedded wiring structure as claimed in claim 5, wherein said wiring trench and said via plug have the same width.

12. The embedded wiring structure as claimed in claim 5, wherein said etch-stop layer is made of silicon nitride.

13. The embedded wiring structure as claimed in claim 5, wherein said via plug is made of tungsten or a tungsten alloy.

* * * * *